US011429769B1

(12) United States Patent
Kar et al.

(10) Patent No.: US 11,429,769 B1
(45) Date of Patent: Aug. 30, 2022

(54) IMPLEMENTING A HARDWARE DESCRIPTION LANGUAGE MEMORY USING HETEROGENEOUS MEMORY PRIMITIVES

(71) Applicant: Xilinx, Inc., San Jose, CA (US)

(72) Inventors: Pradip Kar, Mountain House, CA (US); Nithin Kumar Guggilla, Hyderabad (IN); Chaithanya Dudha, San Jose, CA (US); Satyaprakash Pareek, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/085,838

(22) Filed: Oct. 30, 2020

(51) Int. Cl.
*G06F 30/327* (2020.01)
*G06F 30/33* (2020.01)
*G06F 30/398* (2020.01)
*G11C 7/00* (2006.01)
*G11B 5/00* (2006.01)
*G06F 30/343* (2020.01)

(52) U.S. Cl.
CPC ............ *G06F 30/327* (2020.01); *G06F 30/33* (2020.01); *G06F 30/343* (2020.01); *G06F 30/398* (2020.01); *G11C 7/00* (2013.01)

(58) Field of Classification Search
CPC ...... G06F 30/327; G06F 30/398; G06F 30/33; G06F 30/343; G11C 7/00; G11B 5/26
USPC .......... 716/104, 119, 122, 129, 130; 703/15; 365/189.2; 360/137
See application file for complete search history.

(56) References Cited

U.S. PATENT DOCUMENTS

| | | | | |
|---|---|---|---|---|
| 5,535,163 A * | 7/1996 | Matsui | .................... | G11C 29/48 365/201 |
| 5,701,438 A * | 12/1997 | Bains | .................. | G06F 12/0684 711/211 |
| 5,867,443 A * | 2/1999 | Linderman | ........... | G11C 11/412 365/228 |
| 6,260,127 B1 * | 7/2001 | Olarig | ................. | G06F 13/1694 711/167 |
| 10,777,266 B2 * | 9/2020 | Redaelli | ............. | G11C 13/0004 |
| 11,126,548 B1 * | 9/2021 | Yudanov | ............. | G11C 11/4094 |
| 11,158,392 B2 * | 10/2021 | Muchherla | ........... | G11C 16/349 |
| 11,231,962 B2 * | 1/2022 | Gaster | .................... | G06F 9/5072 |
| 2006/0212725 A1 * | 9/2006 | Kark | ........................ | G06F 1/26 713/300 |

(Continued)

OTHER PUBLICATIONS

Block Memory Generator v8.4, LogiCORE IP Product Guide, Vivado Design Suite, PG058, Dec. 9, 2019, 129 pages.

*Primary Examiner* — Phallaka Kik
(74) *Attorney, Agent, or Firm* — Kevin T. Cuenot

(57) ABSTRACT

Implementing a hardware description language (HDL) memory includes determining, using computer hardware, a width and a depth of the HDL memory specified as an HDL module for implementation in an integrated circuit (IC), partitioning, using the computer hardware, the HDL memory into a plurality of super slices corresponding to columns and the plurality of super slices into a plurality of super tiles arranged in rows. A heterogeneous memory array may be generated, using the computer hardware. The heterogeneous memory array is formed of different types of memory primitives of the IC. Input and output circuitry configured to access the heterogeneous memory array can be generated using the computer hardware.

20 Claims, 13 Drawing Sheets

(56) References Cited

U.S. PATENT DOCUMENTS

| | | | | |
|---|---|---|---|---|
| 2010/0118586 A1* | 5/2010 | Shiratake | ............... | G11C 11/22 365/145 |
| 2011/0051519 A1* | 3/2011 | Lee | ............... | G11C 7/1075 365/185.18 |
| 2011/0063902 A1* | 3/2011 | Lung | ............... | G11C 13/004 365/163 |
| 2011/0072201 A1* | 3/2011 | Lee | ............... | G11C 16/32 711/103 |
| 2013/0332937 A1* | 12/2013 | Gaster | ............... | G06F 9/50 718/104 |
| 2014/0052895 A1* | 2/2014 | Dai | ............... | G06F 3/0625 711/103 |
| 2014/0052900 A1* | 2/2014 | Dai | ............... | G06F 1/32 711/103 |
| 2015/0032940 A1* | 1/2015 | Karamcheti | ............... | G06F 3/061 711/103 |
| 2015/0371694 A1* | 12/2015 | Solihin | ............... | G11C 11/161 712/14 |
| 2016/0246715 A1* | 8/2016 | Ignatowski | ............... | G06F 3/0619 |
| 2017/0131943 A1* | 5/2017 | Le | ............... | G11C 16/06 |
| 2018/0293001 A1* | 10/2018 | Muchherla | ............... | G11C 16/349 |
| 2018/0293029 A1* | 10/2018 | Achtenberg | ............... | G06F 11/1068 |
| 2021/0042037 A1* | 2/2021 | Cariello | ............... | G06F 3/0611 |
| 2021/0294741 A1* | 9/2021 | Yudanov | ............... | G06F 12/0646 |
| 2021/0406176 A1* | 12/2021 | Yudanov | ............... | G06F 12/0646 |
| 2022/0050627 A1* | 2/2022 | Pratt | ............... | G06F 3/0604 |
| 2022/0066638 A1* | 3/2022 | Luo | ............... | G06F 3/0604 |
| 2022/0091975 A1* | 3/2022 | Muchherla | ............... | G06F 12/0882 |

\* cited by examiner

1000

Determine a width and a depth of an HDL memory specified as an HDL module for implementation in an IC
1002

Partition the HDL memory into a plurality of super slices corresponding to columns and the plurality of super slices into a plurality of super tiles arranged in rows
1004

Generate a memory including a plurality of core memory arrays formed of different types of memory primitives of the IC by assigning the plurality of different types of memory primitives to the plurality of super tiles according to size of each super tile
1006

Generate input circuitry and output circuitry configured to access the memory
1008

IMPLEMENTING A HARDWARE DESCRIPTION LANGUAGE MEMORY USING HETEROGENEOUS MEMORY PRIMITIVES

TECHNICAL FIELD

This disclosure relates to integrated circuits (ICs) and, more particularly, to implementing a hardware description language memory using heterogenous memory primitives of an IC.

BACKGROUND

Integrated circuits (ICs) can be implemented to perform a variety of functions. Some ICs can be programmed to perform specified functions. An example of a programmable IC is a field programmable gate array (FPGA). Still, other types of ICs may include programmable circuitry and, as such, be referred to as "programmable ICs." Programmable ICs typically include a variety of different types of circuit resources referred to as primitives. These primitives are used to implement user circuit designs. Memory primitives are among the different circuit resources available on programmable ICs that may be incorporated into user circuit designs.

A user circuit design for implementation in a programmable IC may be specified using a hardware description language (HDL) that is synthesized, placed, and routed. The user circuit design may include one or more memories. Each of the memories, referred to as an HDL memory, may be specified as a single, individual HDL module within the user circuit design. The HDL memory may be sized such that two or more memory primitives of the programmable IC may be needed to physically implement the HDL memory. Electronic design automation (EDA) tools operate on the user circuit design and form each HDL memory using one or more memory primitives of the same type. That is, each HDL memory, being specified in a single HDL module, includes only memory primitives of one type. The implementation of the HDL memory is effectively homogeneous in this regard.

As user circuit designs become more complex and move into different technology spaces such as 5G and machine learning, efficient utilization of on-chip memory becomes increasingly important. In some cases, being restricted to using only one type of memory primitive for each HDL memory means that a significant portion of the memory primitives used to implement any given HDL memory may go unutilized. In other cases, a user circuit design may need to be implemented in a particular region of the programmable IC, thereby reducing the amount of circuit resources, including memory primitives, available to implement the user circuit design. Both of the examples described may result in situations where the user circuit design does not fit within the programmable IC.

SUMMARY

In one aspect, a method can include determining, using computer hardware, a width and a depth of a hardware description language (HDL) memory specified as an HDL module for implementation in an integrated circuit (IC). The method can include partitioning, using the computer hardware, the HDL memory into a plurality of super slices corresponding to columns and the plurality of super slices into a plurality of super tiles arranged in rows. The method can include generating, using the computer hardware, a heterogeneous memory array formed of different types of memory primitives of the IC. The method also can include generating, using the computer hardware, input circuitry and output circuitry configured to access the heterogeneous memory array.

In another aspect, a system can include a processor configured to initiate operations. The operations can include determining a width and a depth of an HDL memory specified as an HDL module for implementation in an IC, partitioning the HDL memory into a plurality of super slices corresponding to columns and the plurality of super slices into a plurality of super tiles arranged in rows, and generating a heterogeneous memory array formed of different types of memory primitives of the IC. The operations also can include generating input circuitry and output circuitry configured to access the heterogeneous memory array.

In another aspect, an IC can include a heterogeneous memory array formed of different types of memory primitives of the IC, input circuitry coupled to the heterogeneous memory array, and output circuitry coupled to the heterogeneous memory array. The heterogeneous memory array is accessible via the input circuitry and the output circuitry and is configured to operate as a single, unified memory.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 10 illustrates an example method of implementing an HDL memory within an IC.

DETAILED DESCRIPTION

Figure 1A:
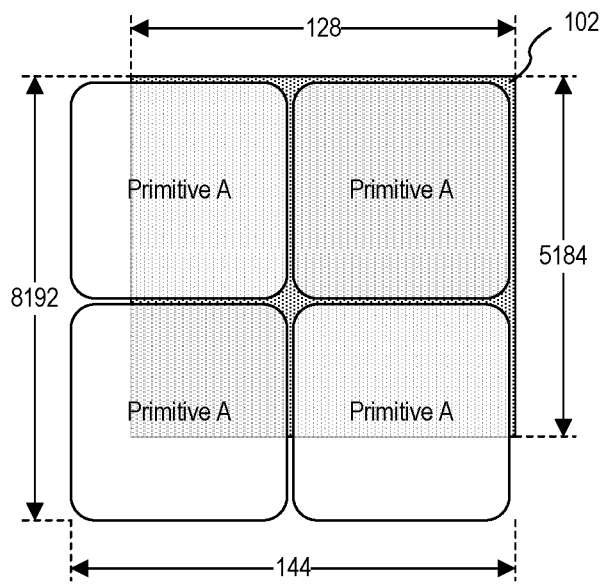
FIGS. 1A and 1B illustrate example hardware implementations of a hardware description language (HDL) memory using existing implementation techniques.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to implementing a hardware description language (HDL) memory using heterogenous memory primitives of an IC. Existing techniques for implementing circuit designs within programmable ICs form memories using a homogeneous approach. For example, in cases where a memory of a user circuit design specified in HDL, e.g., an "HDL memory," is to be implemented and the implementation requires more than one memory primitive, existing implementation techniques implement the HDL memory using a plurality of memory primitives, where each memory primitive used is of the same type.

As an example, a particular programmable IC may include several different types of memory primitives, where each memory primitive is a different size providing a different amount of storage. The memory primitives may have different widths and/or depths and may have different configuration options. For example, memory primitive of type A may be the largest available memory primitive on the programmable IC. Memory primitive of type B may be available on the programmable IC, but is smaller in size than memory primitives of type A. Existing techniques for implementing the HDL memory from the user circuit design implement the HDL memory using only memory primitives of type A or only memory primitives of type B. This approach often leads to sub-optimal utilization of memory primitives of the programmable IC. Memory primitives used to form a given HDL memory, for example, often include unused space, which leads to using more memory primitives of the programmable IC to implement the HDL memory.

In accordance with the inventive arrangements described within this disclosure, an Electronic Design Automation (EDA) system is capable of implementing individual HDL memories specified in a user circuit design using a plurality of different types of memory primitives available on the programmable IC. For example, for a given HDL memory of the user circuit design, the EDA system is capable of generating a memory array that is heterogeneous in that the memory array is formed of two or more different types of memory primitives of the programmable IC. For example, the memory array may include one or more memory primitives of type A and one or more memory primitives of type B interconnected and operating cooperatively with one another. The EDA system also is capable of generating input circuitry and output circuitry for the memory array to implement the HDL memory.

By implementing an HDL memory using different types of memory primitives together, the EDA system is capable of increasing utilization of the memory primitives of the programmable IC. That is, for each given HDL memory that is implemented, the amount of unused space across the memory primitives that are used is reduced. As such, HDL memories may be implemented more efficiently, thereby allowing more and/or larger HDL memories to be implemented in the programmable IC.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1B:
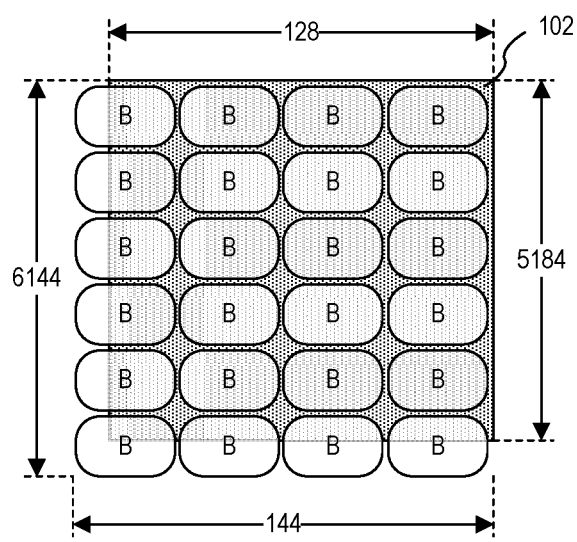

FIGS. 1A and 1B illustrate example hardware implementations of an HDL memory using existing implementation techniques. In the example of FIG. 1A, an HDL memory 102 is shown. HDL Memory 102 may be defined within in a user circuit design specified in an HDL. Examples of HDLs include Verilog and VHDL. The HDL used to specify the user circuit design and HDL memory 102 may be a Register Transfer Level (RTL) description. In the examples described within this disclosure, each HDL memory is specified as a single HDL module. That is, each HDL memory is specified as a different module of the HDL user circuit design hierarchy.

In the examples of FIGS. 1A and 1B, HDL memory 102 has a width of 128 bits and a depth of 5184 bits. FIG. 1A shows a hardware implementation of HDL memory 102 where 4 memory primitives of type A (shown and referred to herein as "primitive A") are used. The memory primitives are superposed on HDL memory 102 to illustrate how much of each respective memory primitive is needed and used to implement HDL memory 102. Those portions of each primitive A of FIG. 1A that are not shaded represent unused portions of the memory primitive. In an example implementation, primitives A may be Ultra random access memories (Ultra RAMs) or URAMS and are available on certain ICs available from Xilinx Inc. of San Jose, Calif. For purposes of illustration, each instance of primitive A may have a width of 72 bits and a depth of 4k bits.

In the example of FIG. 1A, the 4 primitives A have a width of 144 bits and a depth of 8192 bits. The size of HDL memory 102 is 128×5184=648k bits. Since each primitive A is 288k bits in size, the size of the resulting memory using 4 of primitives A is 4×288k=1152k bits. The memory utilization of the hardware implementation of FIG. 1A is 648k bits/1152k bits=56%. Thus, 44% of the memory bits are wasted or unused.

FIG. 1B shows a hardware implementation of HDL memory 102 where 24 memory primitives of type B (shown as "B" and referred to as "primitive B") are used. The memory primitives are superposed on HDL memory 102 to illustrate how much of each respective memory primitive is needed and used to implement HDL memory 102. Those portions of each primitive B of FIG. 1B that are not shaded represent unused portions of the memory primitive. In an example implementation, primitives B may be Block RAMS or BRAMS and are available on certain ICs available from Xilinx Inc. of San Jose, Calif. For purposes of illustration, each instance of primitive B may have a width of 36 bits and a depth of 1k bits.

In the example of FIG. 1B, the 24 primitives B have a width of 144 bits and a depth of 6144 bits. The size of HDL memory 102 is 128×5184=648k bits. Since each primitive B is 36k bits in size, the size of the resulting memory using 24 primitives B is 24×36k=864k bits. The memory utilization of the hardware implementation of FIG. 1B is 648k bits/864k bits=75%. Thus, 25% of the memory bits are wasted or unused.

Figure 2:
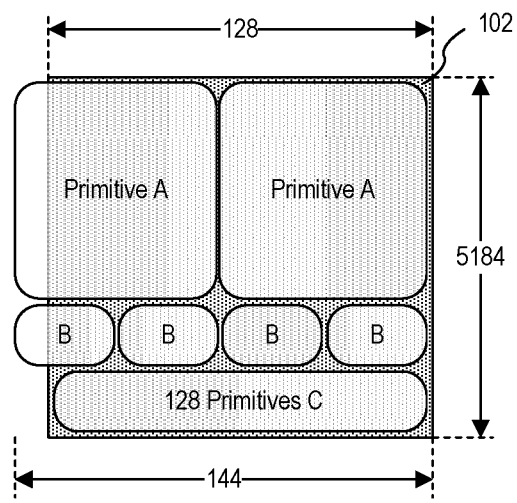
FIG. 2 illustrates an example implementation of an HDL memory using an implementation technique in accordance with the inventive arrangements described within this disclosure.

FIG. 2 illustrates an example implementation of HDL memory 102 using an implementation technique in accordance with the inventive arrangements described within this disclosure. In the example of FIG. 2, the EDA system uses multiple different types of primitives of the programmable IC to implement HDL memory 102. An example EDA system is described herein in connection with FIG. 12. An example architecture for an IC in which HDL memory 102 may be implemented is described in connection with FIG. 13.

In the example of FIG. 2, memory primitives of types A and B, and additional memory primitives of type C are used. In an example implementation, primitives C may be Lookup-Table RAMS or LUTRAMS and/or registers and are available on certain ICs available from Xilinx Inc. of San Jose, Calif. For example, some programmable ICs include configurable logic blocks (CLBs) that may include up to 64 bits of single-port RAM or 32 bits of dual-port RAM. This RAM and the registers may be is distributed throughout the programmable IC and, as such, also may be referred to collectively as "distributed RAM." For purposes of illustration, each unit of distributed RAM (e.g., a LUTRAM and/or a register) is capable of providing 64 bits of memory. Each of the 2 primitives A have a width of 72 bits and a depth of 4k bits. There are 128 primitives C. The sizes of primitives A and B are discussed above. The size of the hardware implementation shown in FIG. 2 is 2×288k+4×36k+128×64=728k bits. The memory utilization of the hardware implementation of FIG. 2 is 648k bits/728k bits=89%. Thus, only 11% of the memory bits are wasted or unused.

Figure 3:
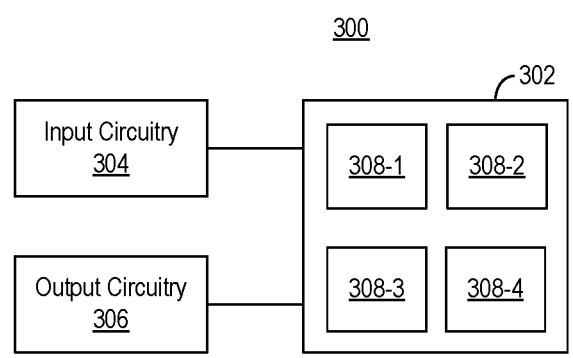
FIG. 3 illustrates an example circuit architecture that may be generated for an HDL memory by an electronic design automation (EDA) tool.

FIG. 3 illustrates an example circuit architecture 300 that may be generated for an HDL memory by an EDA system in accordance with the inventive arrangements described herein. In the example of FIG. 3, circuit architecture 300 includes a heterogenous memory array 302, input circuitry 304, and output circuitry 306.

Heterogeneous memory array 302 includes a plurality of sub-arrays 308. Each of sub-arrays 308 represents a plurality of memory primitives of a same type. While each individual sub-array 308 may be formed of the same type of memory primitive, different ones of sub-arrays 308 are formed of two or more different memory primitives. That is, sub-array 308-1 may be formed using a different type of memory primitive than sub-array 308-3.

An example of heterogeneous memory array 302 is illustrated in FIG. 2. Input circuitry 304 implements the data paths for receiving data as input to be written to the memory primitives of heterogeneous memory array 302 and the control signals (e.g., address, enable, and/or write enable signals) to be provided to the memory primitives. Output circuitry 306 implements the data paths for outputting data read from the memory primitives of heterogeneous memory array 302 and the control signals (e.g., address, read enable, and/or select signals) to be provided to the memory primitives and for controlling the output data paths.

Figure 4A:
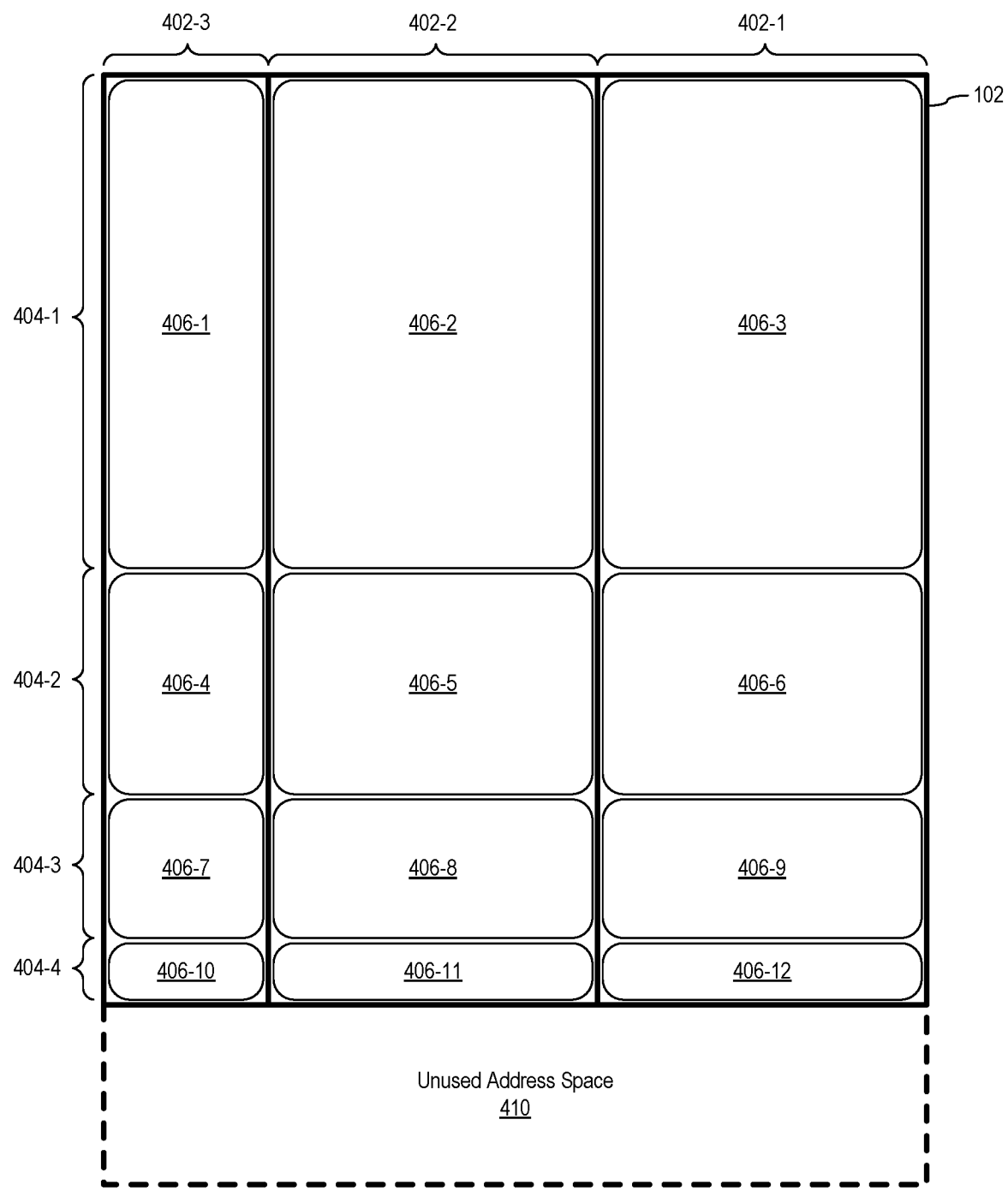
FIGS. 4A and 4B illustrate example partitioning techniques that may be used by an EDA tool to implement an HDL memory.
Figure 4B:
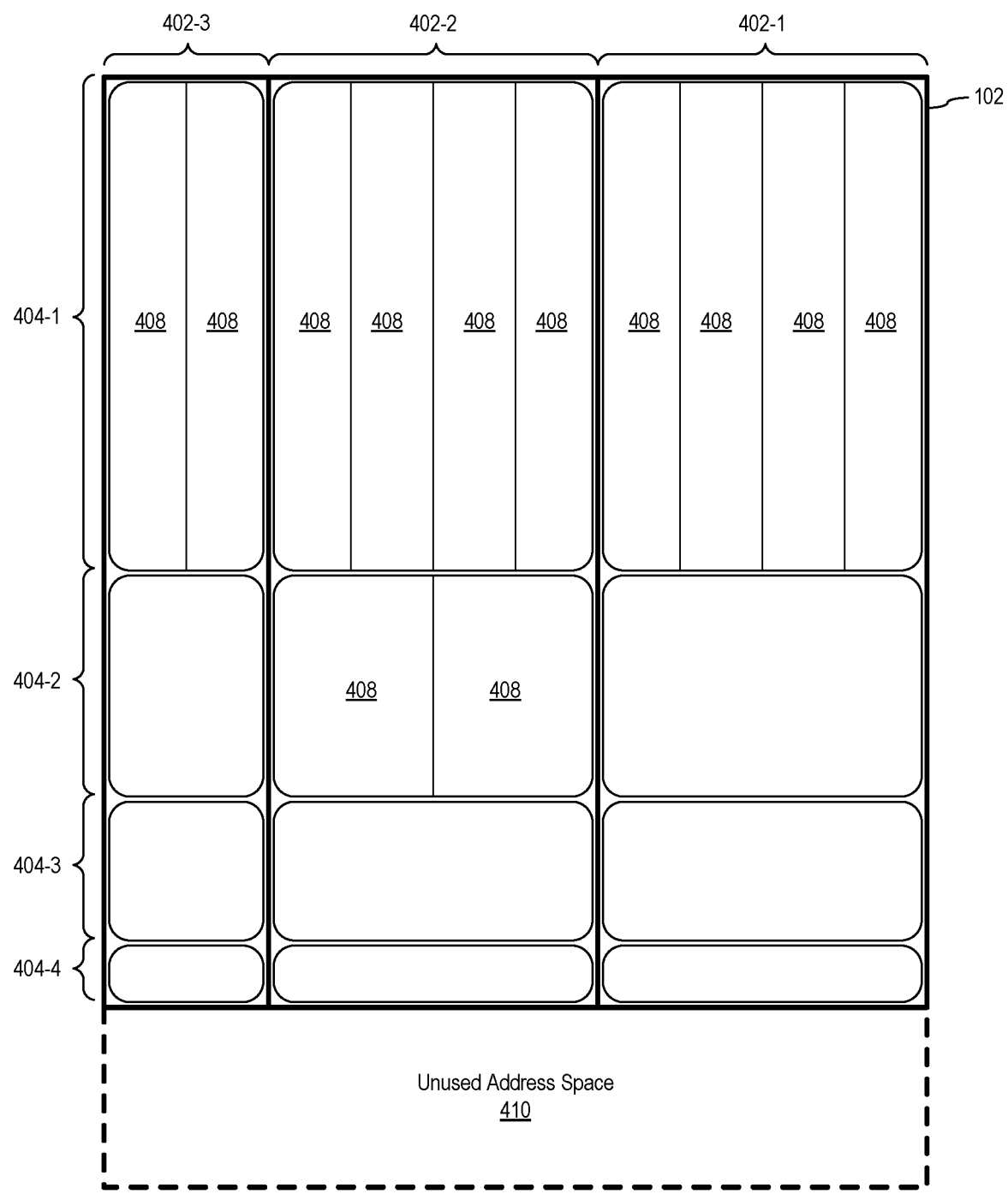

FIGS. 4A and 4B illustrate example partitioning techniques that may be used by an EDA system to implement an HDL memory. In the example of FIGS. 4A and 4B, HDL memory 102 is specified as RTL that defines the width and the depth of the HDL memory. The EDA system is capable of parsing the HDL to determine the width and depth of the HDL memory.

Referring to FIG. 4A, the EDA system is capable of performing a partitioning technique where the HDL memory is subdivided into a plurality of sub-sections or "partitions." Each partition may be implemented independently and then combined through the use of the input and output circuitry that is generated so that the resulting heterogeneous memory array, formed of the partitions, operates as a single, unified memory. In general, each partition is implemented using a selected type of memory primitive based on the size of the partition and the memory primitives of the programmable IC.

In one aspect, the EDA system partitions HDL memory 102 into two or more super slices. In an example implementation, each super slice has a width that is set to the width of the largest memory primitive with the widest configuration available for that memory primitive for the programmable IC. Referring to the prior examples, primitive A may be used with a width of 72 bits. Thus, in the example of FIG. 4A, each super slice may have a width of 72 bits. The depth of each super slice is the depth of the HDL memory. In the example of FIG. 4A, HDL memory 102 is partitioned into super slices 402. In the example, the EDA system begins at the right and proceeds to partition HDL memory 102 into super slices 402-1 and 402-2. Each of super slices 402-1 and 402-2, for example, has a width of 72 bits. The remaining portion of HDL memory 102 located on the left may be partitioned into super slice 402-1, which may be fewer than 72 bits in width. For example, super slice 402-3 may be 16 bits in width.

The EDA system next partitions HDL memory 102 depth wise into super tiles 406. Each super tile 406 has a width that is the same as the width of the super slice 402 from which the super tile 406 is created. Super tiles 406 are arranged in rows 404. For purposes of illustration, the depth of each super tile 406 may be kept to a power of 2, which simplifies generation of the input and output circuitry particularly when the memory primitives are sized at powers of 2. It should be appreciated, however, that other depths may be used and that the inventive arrangements are not intended to be limited by the particular depth of super tiles 406.

The EDA system is also capable of further partitioning selected super tiles width wise to generate memory slices 408 as illustrated in FIG. 4B. In one aspect, the memory slices may be directly mapped to cascade chains of the memory primitives that are used and assigned to the various super tiles for purposes of interconnecting the memory primitives within each super tile. Within this disclosure, the term "cascade chain" refers to circuitry used to multiplex or combine data output from different memory primitives. In some cases, the circuitry used to perform such operations may be implemented external to the memory primitives. For example, lookup tables may be used to multiplex or combine data from a plurality of different memory primitives. In other cases, the circuitry, often referred to as a cascade chain, resides in, e.g., is part of, the respective memory primitives.

The EDA system is capable of assigning each super tile 406 or memory slice 408 (e.g., if so partitioned) a distinct memory region of HDL memory 102. In one example implementation, the EDA system assigns memory regions of HDL memory 102 to super tiles 406 as tuples in the form of <begin_address, end_address, begin_data, end_data>.

Unused Address space 410 represents address space that may be addressed given the number of address bits needed to access the various super tiles 406 and memory slices 408, but which is not assigned a memory primitive of the programmable IC.

In the example of FIGS. 4A and 4B, the EDA system may allocate A primitives to super tiles 406-1 through 406-6. The EDA system may allocate B primitives to super tiles 406-7, 406-8, and 406-9. The EDA system may allocate C primitives to super tiles 406-10, 406-11, and 406-12. In one aspect, super tiles 406 within a same super slice may have a decreasing depth in terms of powers of 2. For example, super tiles in row 404-1 may have a depth of 2^13 (8k), while super tiles in row 404-2 may have a depth of 2^12 (4k), while super tiles in row 404-3 have a depth of 2^11 (2k), etc. Super tiles implemented using C primitives, e.g., distributed RAM, may be implemented in multiples of 64 bits or the size of such memory primitives.

The use of decreasing depths described herein for super tiles 406 organized in rows 404 is for purposes of illustration and not limitation. In other example implementations, the depths of super tiles 406 may be the same from row-to-row, may increase from row-to-row, or may be a mixture of different depths from row-to-row (e.g., include a combination of increasing, decreasing, and/or same depth rows).

It should be appreciated that in cases where a width of a super slice such as super slice 402-3 is narrower than the width of other super slices, the super tiles may be implemented with a different number and/or arrangement of memory primitives. For example, memory primitives used in super tile 406-1 may be configured with a narrower width and greater depth (e.g., by specifying appropriate configuration parameters for such memory primitives) than those used to implement super tiles 406-2 and/or 406-3. A URAM, for example, may be configured to operate with a width of 72, 36, 18, or 9 bits. The depth of the URAM is varied based on the configuration of the width. Other memory primitives such as BRAMs may be similarly configurable, albeit with different widths and depths. In other example implementations, widths of super tiles may differ according to other schemes, e.g., where a plurality of super tiles have a same width and one or more other super tiles have a larger width.

It should be appreciated that the widths of super tiles 406 may be the same as that of the respective super slices 402 from which the super tiles are formed, such that super tiles 406 may have varying widths like super slices 402. The particular widths used herein and the relationship of widths of super tiles relative to one another is provided for purposes of illustration and not limitation. Other widths for super tiles may be used and/or specified and track the widths of the super tiles.

In one or more other example implementations, different super slices 402 may have different numbers of rows 404. For example, the number of rows formed for super slice 402-3 may be different than the number of rows for super tile 402-2 and/or 402-1.

Figure 5:
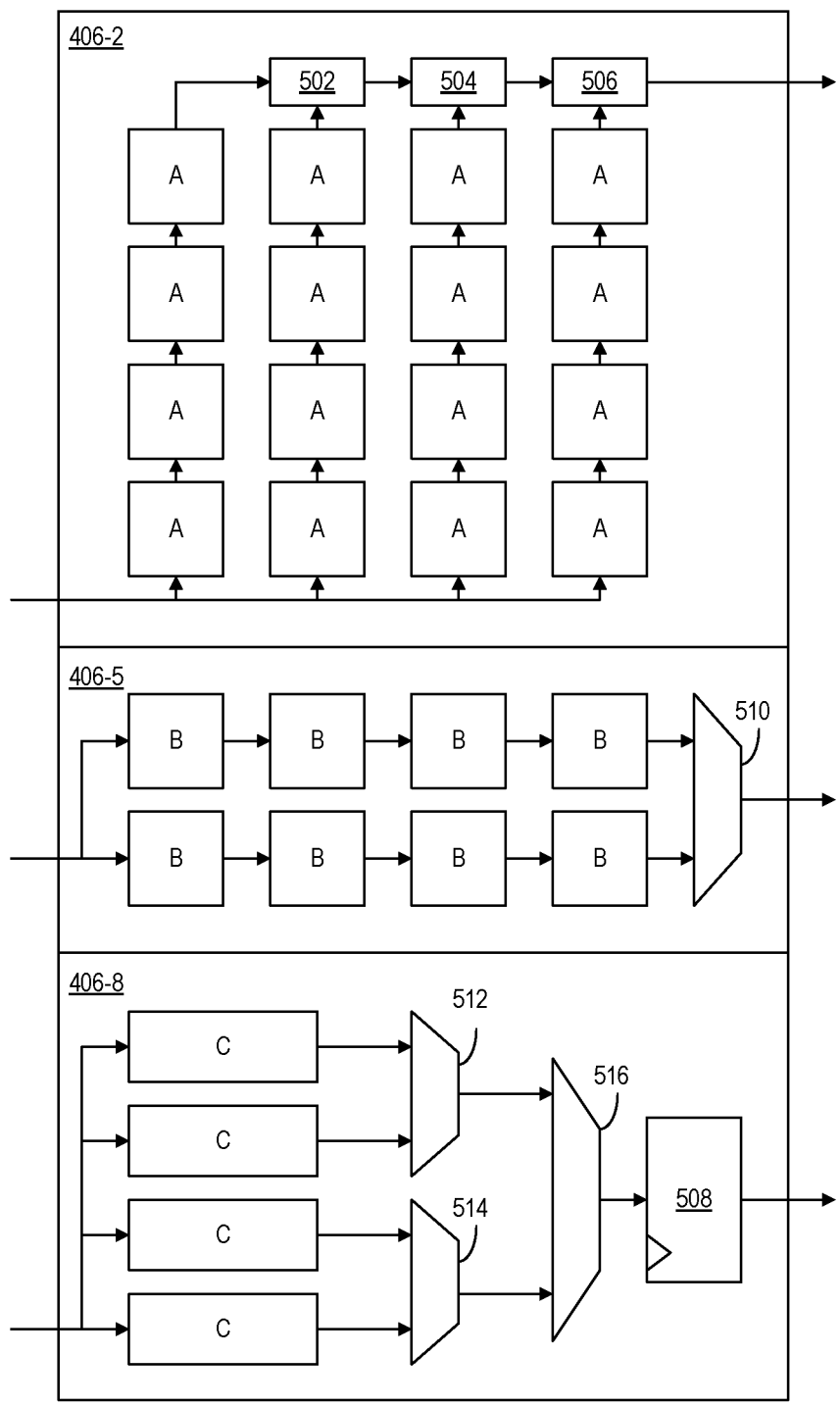
FIG. 5 illustrates an example implementation of super tiles of a heterogeneous memory array.

FIG. 5 illustrates an example implementation of super tiles 406 in accordance with the inventive arrangements. In the example of FIG. 5, super tiles 406-2, 406-5, and 406-8 are shown. For purposes of illustration, super tile 406-2 is formed of, or allocated, one or more A primitives. Super tile 406-5 is formed of, or allocated, one or more B primitives. Super tile 406-8 is formed of, or allocated, one or more C primitives. As noted, memory primitives are assigned to each partition based on the size of the partition and the size of the available memory primitives of the programmable IC. For example, assuming that each of A, B, and C primitives are feasible for the HDL memory to be implemented, the EDA system assigns memory primitive types to partitions, e.g., super tiles, based on size of the partition and the size of the respective memory primitives. In another aspect, the EDA system is capable of implementing a resource allocation-based strategy that allocates less efficient resources, e.g., B primitives, in response to determining that more efficient resources, e.g., A primitives, are not available.

In the example of FIG. 5, the A primitives may be interconnected as a matrix flowing into registers 502, 504, and 506. The number of registers shown is for purposes of illustration. B primitives may be interconnected as cascades flowing into a multiplexer 510. C primitives may be interconnected using multiplexer logic including example multiplexers 512, 514, and 516 flowing into register 508. The various types of memory primitives shown may be interconnected within each respective super tile using existing or known circuit design techniques. Fewer or more registers may be required to balance latencies among the different super tiles given the different types of memory primitives and connecting circuitry used.

The EDA system is capable of generating the auxiliary circuitry, e.g., in reference to input circuitry 304 and output circuitry 306, necessary for each super tile to perform correct memory operations. The EDA system is capable of generating the necessary data and control signals from the original HDL signals specified for HDL memory 102.

The "data in" signal represents the incoming data to be written to HDL memory 102. The original data in signal provided to HDL memory 102 may be sliced into widths that are the same as the super slices generated for the HDL memory. Each slice of the data in signal is provided to a corresponding super slice. Each of the super tiles in the same super slice receives the same data, e.g., the same slice of the data in signal.

In terms of addressing, each super tile represents a sub range of words from the HDL memory. The address for each super tile is a portion taken from the HDL memory's address. In one aspect, the EDA system determines the address for each super tile. Consider the case where D=depth of a super tile, and N=Log 2(D)=the number of bits needed to address the depth D of the super tile. In that case, the EDA system is capable of extracting N Least Significant Bits (LSBs) from the original address and providing such bits to the super tile as address bits.

The enable and write enable signals ensure that one super tile is enabled for a memory operation while all other super tiles in same super slice are disabled for purposes of a write operation. To accomplish this, the EDA system is capable of generating decoder circuitry based on the range of words that each super tile addresses. The decoder circuitry may be generated as a function of a portion of the address and an original enable of the HDL memory. In one aspect, the EDA system generates decoder circuitry for each super tile so that each super tile has its own decoder circuitry generated based on the exact range of words that super tile stores or represents from the HDL memory being implemented. In implementations where reading and writing occur on different ports, the decoding operations performed by the decoding circuitry for the corresponding port will depend on the respective read or write address.

For example, if the original address bus width is M and the address bus of the super tile is N, the decoder circuitry for the super tile will receive the M-N Most Significant Bits (MSBs) from the original address bus. The enable of the super tile may be implemented as the AND of the original enable from the HDL memory and the decode function implemented by the decode circuitry. The write enable of the super tile may be implemented as the AND of the original write enable and the decode function implemented by the decode circuitry. The decode function implemented by the decode circuitry may be the AND of the address bits in either direct or complement form on the range.

For purposes of illustration, consider an example where the EDA system is building decode circuitry for a super tile that represents a word range of [20:23] for a 32 word portion of an HDL memory. The super tile has a binary tile start=10100 and a binary tile end=10111. In this example, the EDA system allocates 5 bits (A4, A3, A2, A1, and A0) of address bus for the super tile. The super tile requires 2 LSBs (A0 and A1) to address the range of 4 words. The EDA system uses the remaining 3 bits (A2, A3, and A4) of the 5 bits of address bus for the decoding. Since the value of 3 bits is 101, the decode function implemented by the decode circuitry of the super tile is: A4 AND ~A3 AND A2 (where ~A3=NOT A3).

Figure 6:
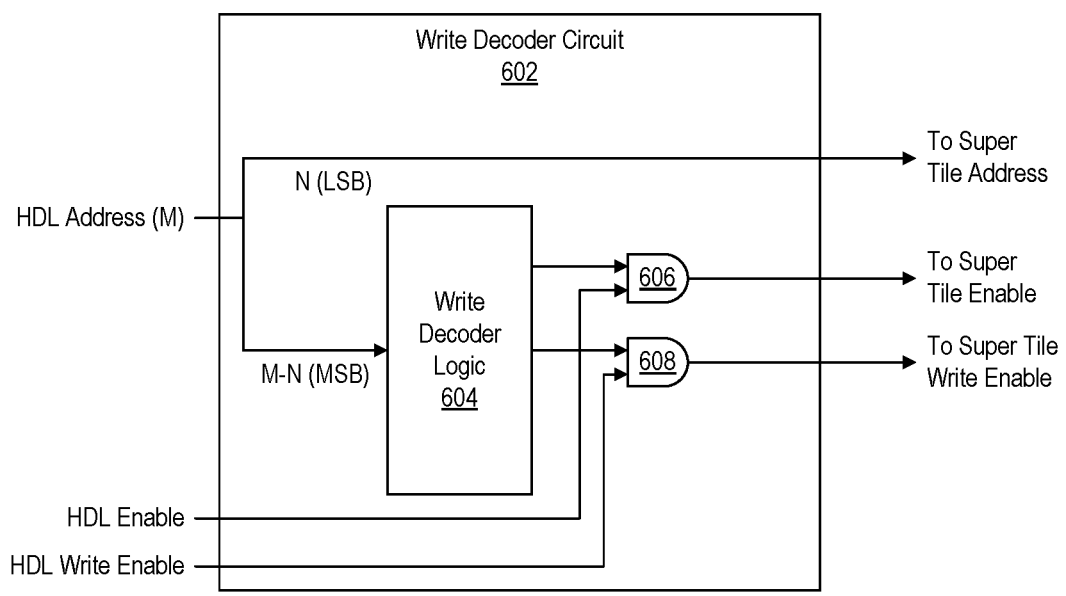
FIG. 6 illustrates an example of write decoder circuitry that may be generated by an EDA system in accordance with the inventive arrangements described herein.

FIG. 6 illustrates an example of write decoder circuitry 602 that may be generated by an EDA system in accordance with the inventive arrangements described herein. In the example of FIG. 6, write decoder circuitry 602 may be implemented as part of input circuitry 304 described in connection with FIG. 3. As noted, the "data in" signal, representing the incoming data to be written to HDL memory 102, may be sliced into widths that are the same as the widths of the super slices generated for the HDL memory. Each slice of the data in signal is provided to a corresponding super slice. Each of the super tiles in the same super slice receives the same data.

As shown, write decoder circuitry 602 receives the HDL address signal of M bits in width, the HDL enable signal, and the HDL write enable signal. The M-N MSBs of the address signal are provided to write decoder logic 604, which implements the decoding function. Referring to the prior example, write decoder logic 604 implements the decoding function "A4 AND ~A3 AND A2." The N LSBs of the HDL address signal are provided to the memory primitives of the super tile as address bits. AND gate 606 is capable of generating the enable signal for the super tile as the logical AND of the output of write decoder logic 604 and the HDL enable signal. AND gate 608 is capable of generating the write enable signal for the super tile as the logical AND of the output of write decoder logic 604 and the HDL write enabler signal.

The EDA system is capable of generating write decoder circuitry 602 for each super tile of a super slice to implement the HDL memory. Decoder circuitry 602 generates the address signals (N LSBs of the HDL address signal) and the control signals including the enable and the write enable signals for the super tile.

Figure 7:
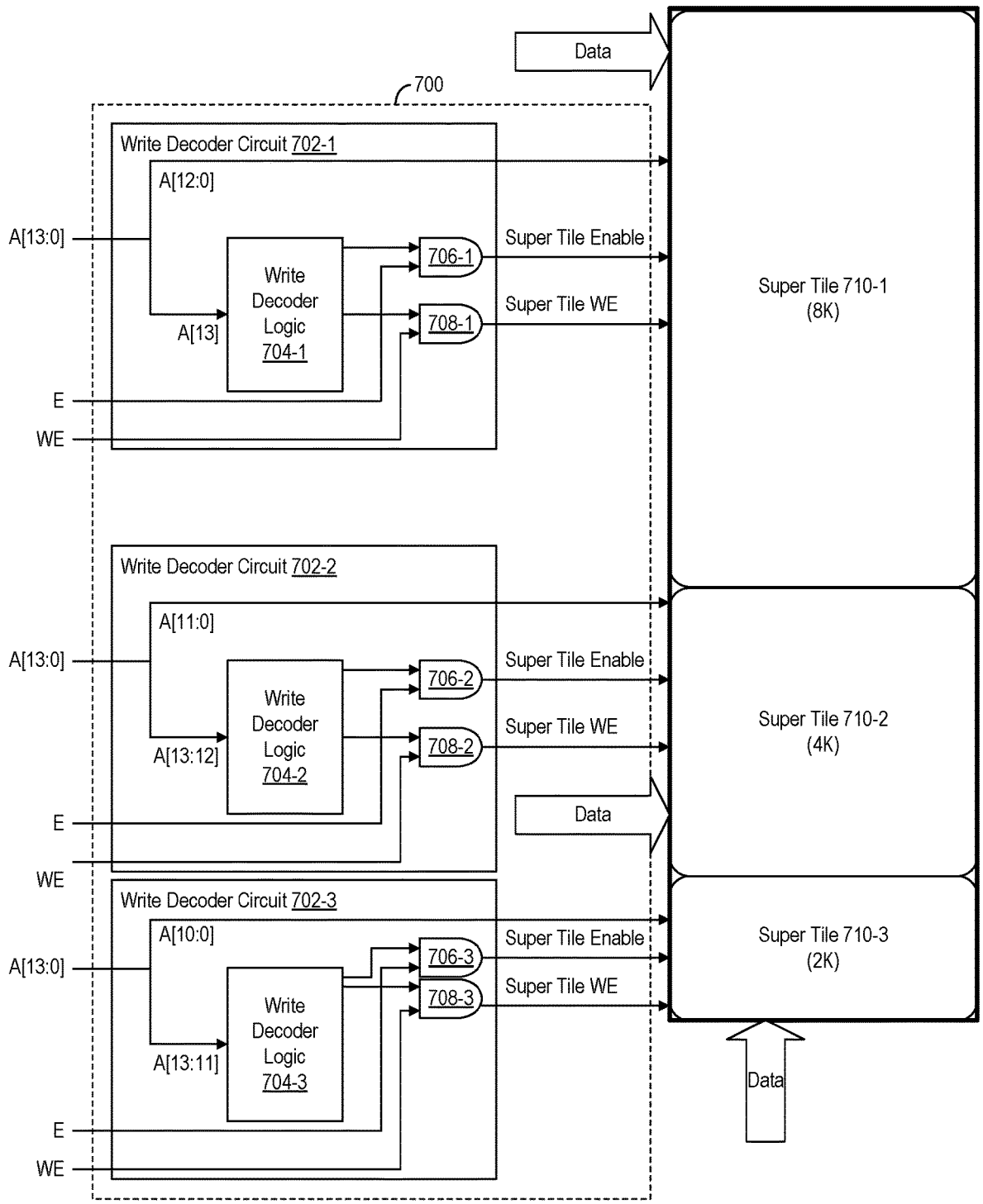
FIG. 7 illustrates another example of write decoder circuitry that may be generated by an EDA system in accordance with the inventive arrangements described herein.

FIG. 7 illustrates another example of write decoder circuitry 700 that may be generated by an EDA system in accordance with the inventive arrangements described herein. In the example of FIG. 7, write decoder circuitry 700 includes write decoder circuits 702-1, 702-2, and 702-3 each connected to, and configured to control, a different super tile 710-1, 710-2, and 710-3, respectively. Each write decoder circuit 702 includes write decoder logic 704 and AND gates 706, 708 as previously described. In the example of FIG. 7, A[13:0] represents the HDL address signal, E represents the HDL enable signal, and WE represents the HDL write enable signal. Each write decoder circuit 702 outputs the address signal, the super tile enable, and the super tile write enable (WE) for the corresponding super tile 710. Each of super tiles 710, being in the same super slice, receives the same data.

Figure 8:
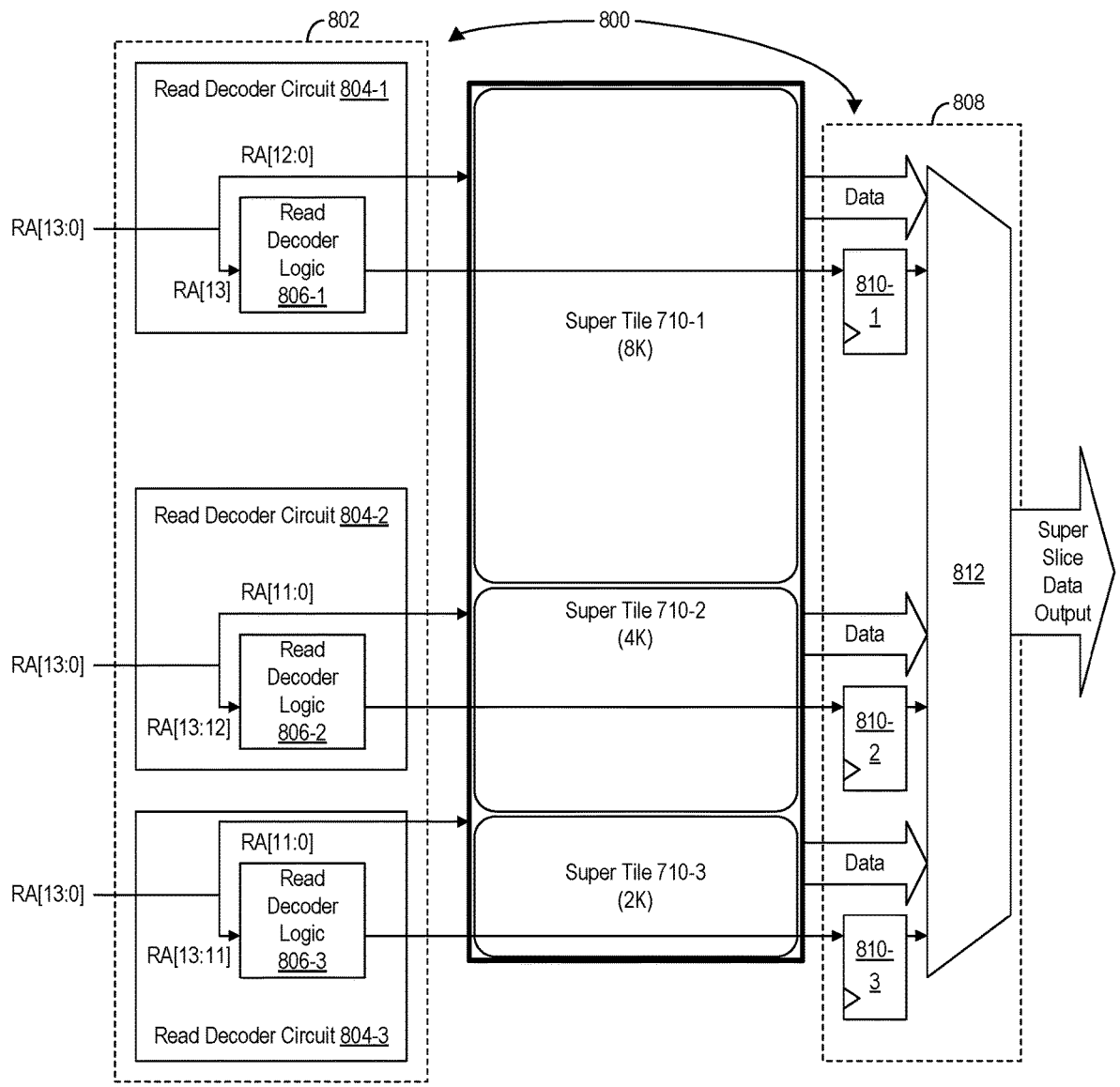
FIG. 8 illustrates an example of output circuitry for a super slice.

FIG. 8 illustrates an example of output circuitry 800 for a super slice. In the example of FIG. 8, output circuitry 800 includes read decoder circuitry 802 and data output circuitry 808. Read decoder circuitry 802 includes a plurality of read decoder circuits 804. Each read decoder circuit 804 includes read decoder logic 806. Data output circuitry 808 includes registers 810 and multiplexer 812.

In the example of FIG. 8, each instance of read decoder logic 806 implements a decode function that is specific to the super tile controlled by the respective read decoder circuit 804. As shown, each read decoder circuit 804 receives the read address (RA) which is the HDL read address signal. Each instance of read decoder logic 806 is configured to generate a select signal that is provided to the corresponding register 810 and to multiplexer 812 such that only one data path (e.g., the data output from one super tile) is selected and passed by multiplexer 812 at a time. Read decoder logic 806 may be similar to the write decoder logic 704 illustrated in FIG. 7. In cases where the memory is implemented as a single port memory and the read address and the write address are the same, the decoding logic (e.g., read decoder logic and write decoder logic) also will be the same. That is, there need only be one instance of decoder logic for both read and write per super tile.

Each of super tiles 710 has its own data output from the memory primitives used to form that super tile. Example circuitry configured for outputting data from super tiles is described in connection with FIG. 5. Multiplexer 812, in response to the received select signals, outputs the data from only one super tile in the super slice at a time as the super slice data output. Thus, only one word addressed by the read address bus is output at a time.

In one or more example implementations, multiplexer 812 may be implemented as a parallel multiplexer structure that is configured to pass the data output of one particular super tile at a time based on the received select signals. Multiplexer 812 may be implemented using any of a variety of available circuit resources such as, for example, AND gates and/or OR gates, or LUTRAMs.

Figure 9:
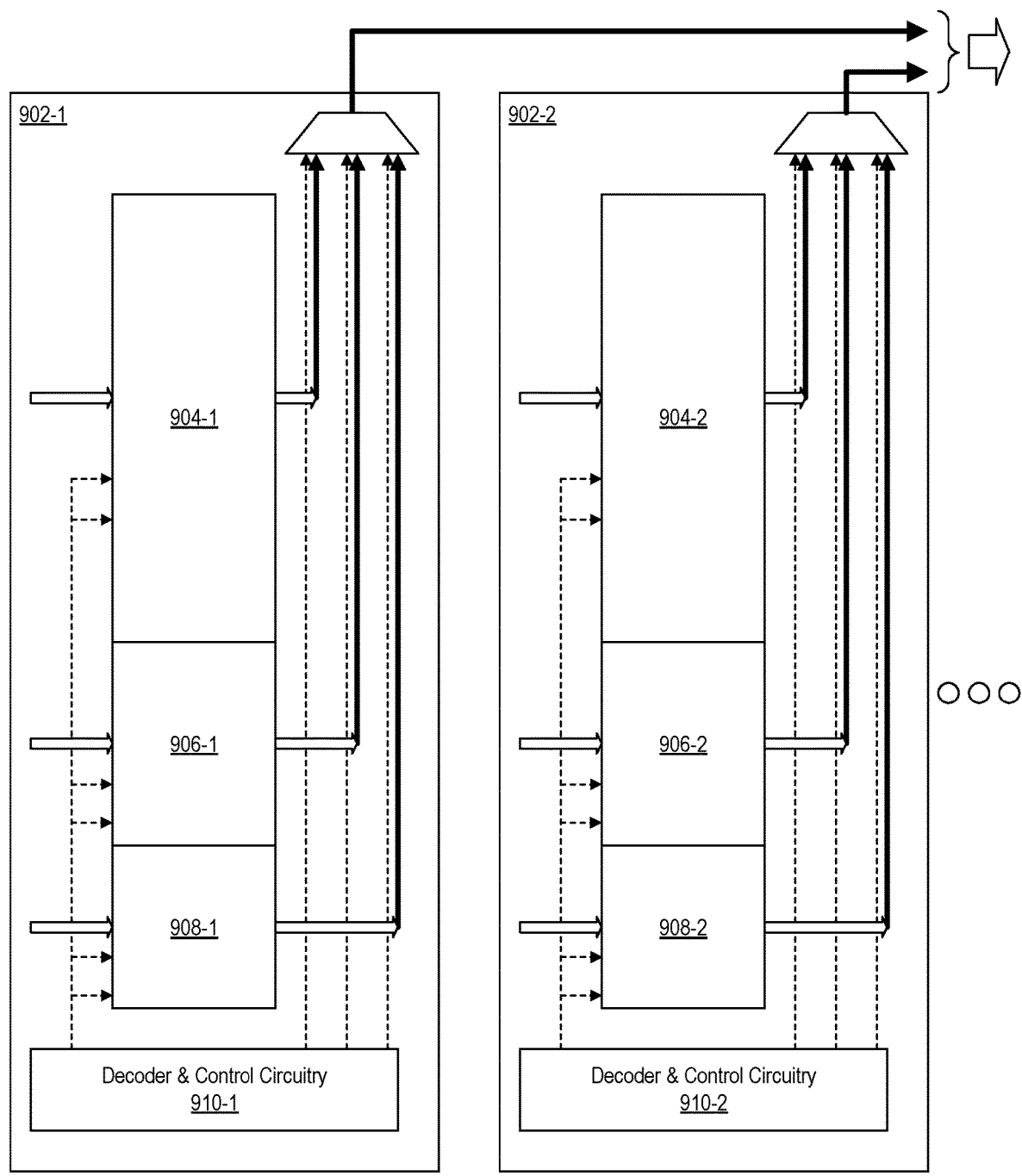
FIG. 9 illustrates an example implementation of an HDL memory.

FIG. 9 illustrates an example implementation of an HDL memory. The example of FIG. 9 includes super slices 902 implemented as shown. Each super slice 902 includes super tiles 904, 906, and 908. Each super tile 904, 906, and 908 is implemented as a sub-array. Further, each super slice 902 includes decoder and control circuitry 910. In the example of FIG. 9, two or more of the sub-arrays in the same super slice are formed of different memory primitives. For example, sub-array implemented for super tile 904 may include different memory primitives than the sub-array implemented for super tile 906 and/or different memory primitives than the sub-array implemented for super tile 908.

FIG. 10 illustrates an example method 1000 of implementing an HDL memory within an IC. Method 1000 may be performed using an EDA system. An example of an EDA system is described in connection with FIG. 12. The IC may be a programmable IC. An example architecture for an IC in which the HDL memory may be implemented is described in connection with FIG. 13.

In block 1002, the EDA system is capable of determining a width and a depth of the HDL memory to be implemented. The HDL memory is specified as an HDL module for implementation in an IC. In block 1004, the EDA system is capable of partitioning the HDL memory into a plurality of super slices corresponding to columns and the plurality of super slices into a plurality of super tiles arranged in rows. In block 1006, the EDA system is capable of generating a heterogeneous memory array formed of different types of memory primitives of the IC. In block 1008, the EDA system is capable of generating input circuitry and output circuitry configured to access the memory.

The foregoing and other implementations can each optionally include one or more of the following features, alone or in combination. Some example implementations include all the following features in combination.

In one aspect, the method can include assigning the plurality of different types of memory primitives to the plurality of super tiles according to size of each super tile, wherein each super tile corresponds to a sub-array of the heterogeneous memory array. The type of memory primitive assigned to each super tile may be determined independently.

In another aspect, the EDA system is capable of determining compatibility of the plurality of different types of memory primitives with the HDL memory and excluding each type of memory primitive of the IC that is incompatible with the HDL memory from use in the heterogeneous memory array.

In another aspect, the super slices have widths determined based on a widest of the plurality of types of memory primitives of the IC. In another aspect, the plurality of super tiles have at least one of different depths or different widths. For example, the super tiles may have depths that decrease according to row in the heterogeneous memory array. In one or more example implementations, each depth of a super tile is a power of 2. It should be appreciated that in other example implementations, the depths of the super tiles need not decrease. For example, the depths of the super tile may increase, may remain the same, may decrease and increase in varying order, or be implemented with a combination of the foregoing. Further, the widths may be the same, may decrease, may increase, may decrease and increase in varying order, or be implemented with a combination of the foregoing.

The EDA system is also capable of creating new data signals, address signals, and control signals from respective ones of data signals, address signals, and control signals of the HDL memory. The EDA system also is capable of combining data outputs from the plurality of super tiles to create a data output for each of the plurality of super slices and combining the data outputs of the plurality of super slices to create a data output for the heterogeneous memory array. In another aspect, the type of memory primitive assigned to each super tile may be determined independently.

Figure 11:
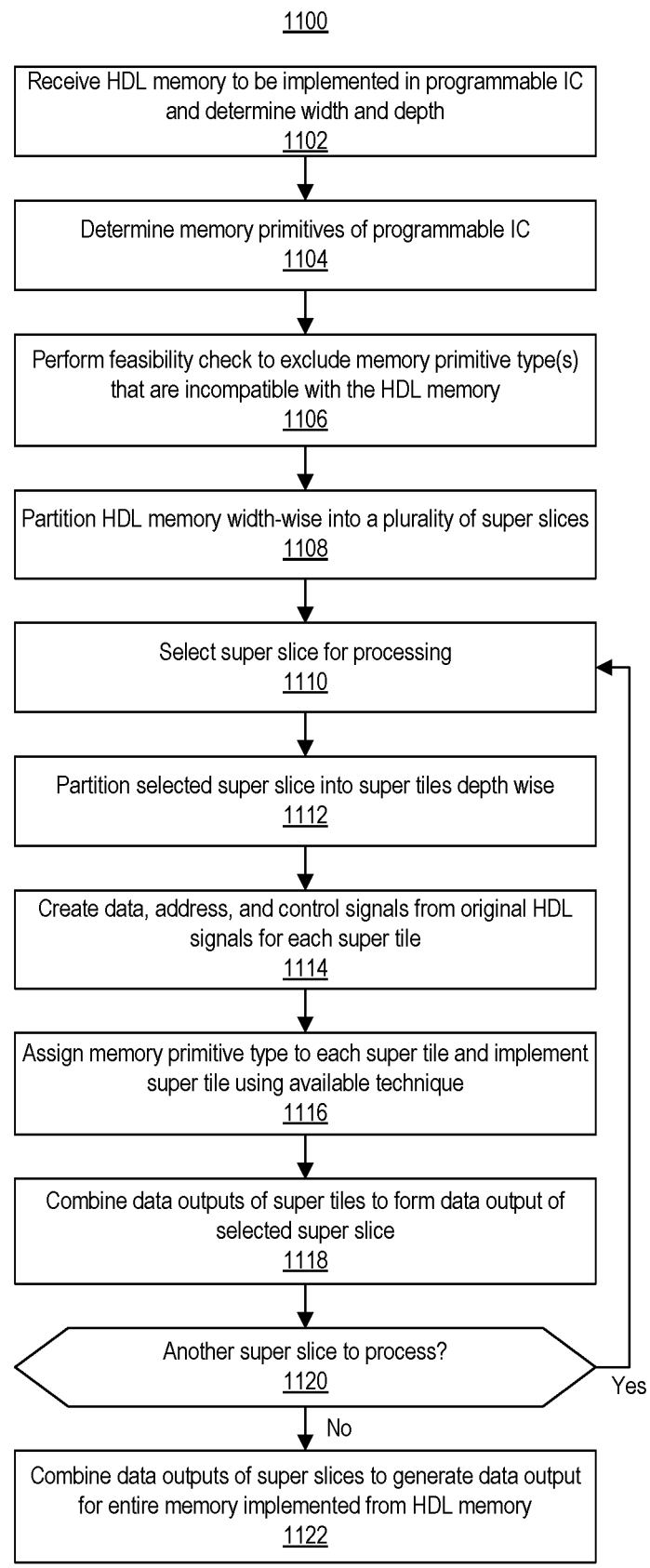
FIG. 11 illustrates another example method of implementing an HDL memory within an IC.

FIG. 11 illustrates another example method 1100 of implementing an HDL memory within an IC. Method 1100 may be performed using an EDA system. An example of an EDA system is described in connection with FIG. 12. The IC may be a programmable IC. An example architecture for an IC in which the HDL memory may be implemented is described in connection with FIG. 13.

In block 1102, the EDA system receives an HDL memory. The HDL memory may be specified within, or as part of, a user circuit design provided to the EDA system for implementation in a programmable IC. As discussed, the HDL memory may be specified as RTL and may be contained within a single module of HDL. The module of HDL specifies a depth and a width for the HDL memory. The EDA system is capable of parsing the HDL memory to determine the width and depth.

In block 1104, the EDA system determines the particular memory primitives that are available on the programmable IC in which the HDL memory is to be implemented. For example, the user may specify, via an input to the EDA system, the particular model of programmable IC to be used thereby allowing the EDA system to retrieve a list of the memory primitives available for the user specified programmable IC from a database or other data structure of such memory primitives correlated to different programmable ICs.

In block 1106, the EDA system is capable of performing a feasibility check on the list of memory primitives for the programmable IC. The EDA system, for example, is capable of detecting which, if any, of the memory primitives of the programmable IC is/are incompatible with the HDL memory to be implemented based on memory primitive type. The EDA system is capable of omitting any memory primitive type(s) identified in block 1106 from consideration and/or use in implementing the HDL memory.

As an illustrative and non-limiting example, the EDA system is capable of determining whether the HDL memory to be implemented uses two distinct clocks. Certain memory primitives, e.g., A primitives, may not be compatible with HDL memories that use more than one clock. Accordingly, the EDA system may exclude A primitives from consideration and use in implementing the HDL memory in response to determining that the HDL memory uses more than one clock signal. In another example, the EDA system is capable of detecting whether the HDL memory has two distinct write cycles. Distributed RAM may not be used to implement an HDL memory with two distinct write cycles. Accordingly, the EDA system may exclude distributed RAM memory primitives from consideration and use in implementing the HDL memory in response to determining that the HDL memory has two distinct write cycles. Subsequent to block 1106, only those memory primitive types of the programmable IC that are compatible with the HDL memory to be implemented remain for consideration and use.

In block 1108, the EDA system is capable of partitioning the HDL memory width wise into a plurality of super slices. As discussed, the HDL memory may include two or more super slices. Super slice partitioning is illustrated in connection with FIG. 4.

In block 1110, the EDA system selects a super slice for processing. In block 1112, the EDA system partitions the selected super slice depth wise to form a plurality of super tiles. In block 1114, for example, as part of generating the input and/or output circuitry, the EDA system is capable of generating data, address, and control signals from the original HDL signals of the HDL memory. The EDA system performs the operations of block 1114 for each super tile of the selected super slice. In block 1116, the EDA system is capable of assigning a memory primitive type to each super tile of the selected super slice. Further, the EDA system is capable of implementing each super tile using the selected type of memory primitive for that super tile using an available implementation technique. For example, certain memory primitives may be interconnected in known ways such as in a matrix or cascaded where individual memory primitives of the same type are combined to form a larger memory. Such techniques may be used on a per super tile basis.

For example, in the case where a super tile has a width of 72 bits and a depth of 8k bits, a URAM having a width of 72 bits and a depth of 4k may be used as such memory primitive type fits in the super tile with little or no wasted memory bits. If the next super tile has a width of 72 bits and a depth of 4k bits, URAMs may still be used. If the next super tile has a width of 72 bits and a depth of 2k bits, a significant amount of URAM will be wasted if selected. In one aspect, the EDA system can compare the amount of unused bits if a given memory primitive type is selected for a super tile with a threshold and, if the amount of unused bits exceeds the threshold (e.g., specified in terms of a number of bits or a percentage of unused bits as previously discussed herein), select the next smallest memory primitive for the super tile. Thus, in this example, the EDA system may select a BRAM (e.g., 4 BRAMs) for the super tile sized at 72 bits in width and 2k bits in depth. Similarly, for a super tile that is 128 bits in size, the EDA system may select distributed RAMs since BRAMs result in too much wasted space. The example memory primitive type selection described herein is provided for purposes of illustration and is not intended as a limitation. Other types of fitting techniques for memory primitives to super tiles may be used.

In block 1118, for example, as part of generating the input and/or output circuitry, the EDA system is capable of combining the data outputs of the super tiles of the selected super slice to form a data output for the selected super slice. In block 1120, the EDA system determines whether there is another super slice to process. In response to determining that there is at least one more super slice that has yet to be processed, method 1100 loops back to block 1110 to select another super slice for processing. In response to determining that there are no further super slices remaining to process, method 1100 continues to block 1122.

In block 1122, for example, as part of generating the input and/or output circuitry, the EDA system is capable of combining the data outputs of the super slices to generate an output of the entire memory that is implemented from the HDL memory.

Figure 12:
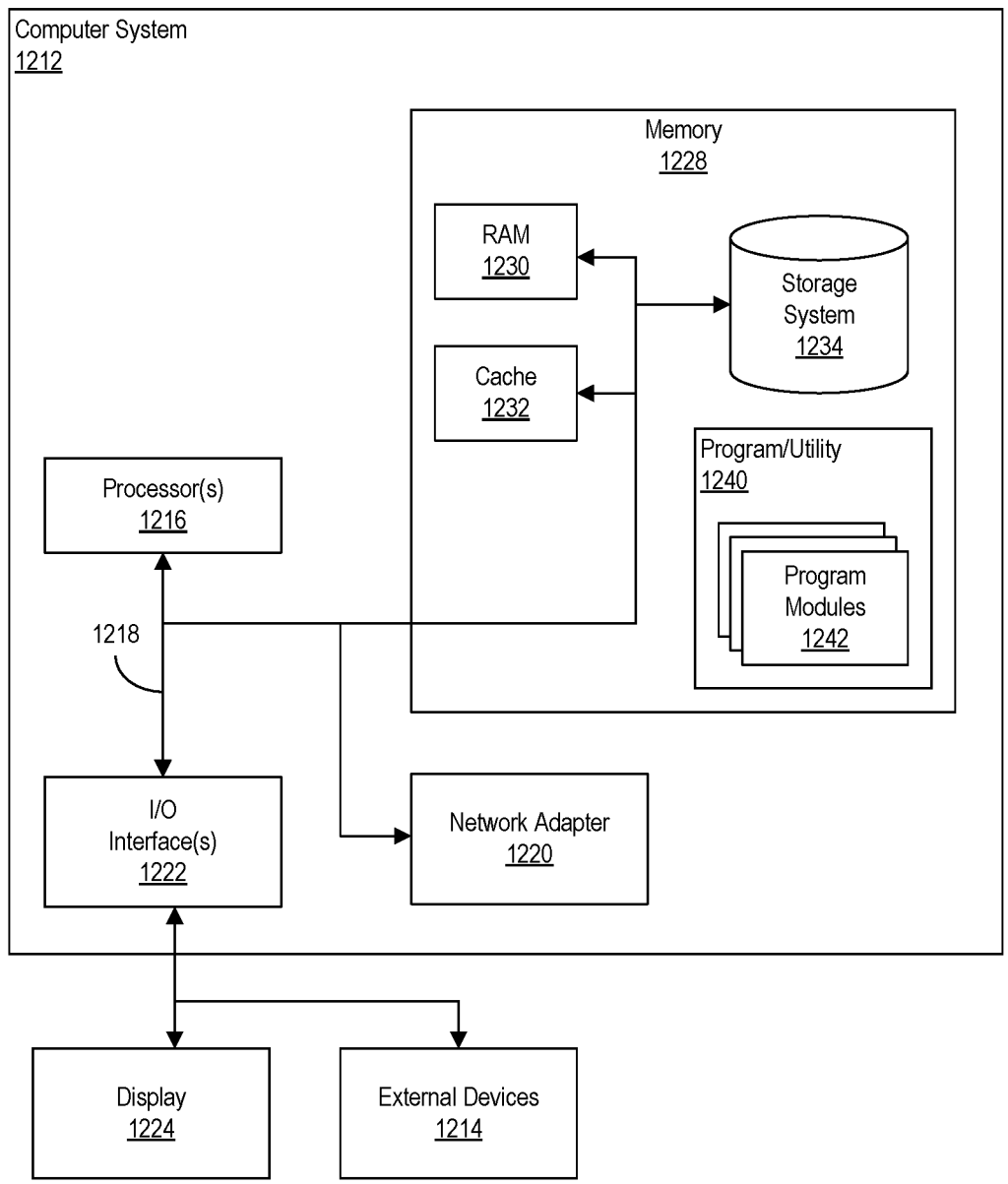
FIG. 12 illustrates an example computing node for use with the inventive arrangements described herein.

FIG. 12 illustrates an example computing node 1200. In one or more example implementations, computing node 1200 is an example of a suitable cloud computing node. Computing node 1200 is also an example of computer hardware and may be used to implement an EDA system as described herein. Computing node 1200 is not intended to suggest any limitation as to the scope of use or functionality of the example implementations described herein. For example, computing node 1200 may also represent a personal computing or data processing system or a server.

Computing node 1200 includes a computer system 1212, which is operational with numerous other general-purpose or special-purpose computing system environments or configurations. Examples of well-known computing systems, environments, and/or configurations that may be suitable for use with computer system 1212 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 1212 may be described in the general context of computer system-executable instructions, such as program modules, being executed by a computer system. Generally, program modules may include routines, programs, objects, components, logic, data structures, and so on that perform particular tasks or implement particular abstract data types. In one aspect, computer system 1212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 12, computer system 1212 is shown in the form of a general-purpose computing device. The components of computer system 1212 may include, but are not limited to, one or more processors 1216, a memory 1228, and a bus 1218 that couples various system components including memory 1228 to processor 1216. As defined herein, "processor" means at least one hardware circuit configured to carry out instructions. The hardware circuit may be an IC. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

The carrying out of instructions of a computer program by a processor comprises executing the program. Within this disclosure, the term "execute" refers to a series of actions or events performed by the processor in accordance with one or more machine-readable instructions. The term "executing" refers to the active performing of actions or events by the processor. The terms execute and executing are used synonymously herein.

Bus 1218 represents one or more of any of several types of bus structures, including a memory bus or memory controller, a peripheral bus, an accelerated graphics port, and a processor or local bus using any of a variety of bus architectures. By way of example only, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Computer system 1212 typically includes a variety of computer system-readable media. Such media may be any available computer readable media that is accessible by computer system 1212, and may include both volatile and non-volatile media, removable and non-removable media.

Memory 1228 may include computer system readable media in the form of volatile memory, such as RAM 1230 and/or cache memory 1232. Computer system 1212 may further include other removable/non-removable, volatile/non-volatile computer system storage media. By way of example, storage system 1234 can be provided for reading from and writing to a non-removable, non-volatile magnetic media and/or solid-state drive(s) (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1218 by one or more data media interfaces. As will be further depicted and described below, memory 1228 may represent at least one computer program product having a set (e.g., at least one) of program modules that are configured to carry out the functions of the example implementations described herein.

Program/utility 1240, having a set (at least one) of program modules 1242, may be stored in memory 1228 by way of example, and not limitation, as well as an operating system, one or more application programs, other program modules, and program data. Each of the operating system, one or more application programs, other program modules, and program data or some combination thereof, may include an implementation of a networking environment. Program modules 1242 generally carry out the functions and/or methodologies of example implementations of the invention as described herein. For example, one or more of the program modules may be executed by processor 1216 to implement HDL memories within ICs as described herein.

Program/utility 1240 is executable by processor 1216. Program/utility 1240 and any data items used, generated, and/or operated upon by computer system 1212 are functional data structures that impart functionality when employed by computer system 1212. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Computer system 1212 may also communicate with one or more external devices 1214 such as a keyboard, a pointing device, a display 1224, etc.; one or more devices that enable a user to interact with computer system 1212; and/or any devices (e.g., network card, modem, etc.) that enable computer system 1212 to communicate with one or more other computing devices. Such communication can occur via input/output (I/O) interfaces 1222. Still, computer system 1212 can communicate with one or more networks such as a local area network (LAN), a general wide area network (WAN), and/or a public network (e.g., the Internet) via network adapter 1220. As depicted, network adapter 1220 communicates with the other components of computer system 1212 via bus 1218. It should be understood that although not shown, other hardware and/or software components could be used in conjunction with computer system 1212. Examples, include, but are not limited to, microcode, device drivers, redundant processing units, external disk drive arrays, RAID systems, tape drives, and data archival storage systems, etc.

While computing node 1200 is used to illustrate an example of a cloud computing node, it should be appreciated that a computer system using an architecture the same as or similar to that described in connection with FIG. 12 may be used in a non-cloud computing implementation to perform the various operations described herein. In this regard, the example implementations described herein are not intended to be limited to a cloud computing environment. Computing node 1200 is an example of a data processing system. As defined herein, "data processing system" means one or more hardware systems configured to process data, each hardware system including at least one processor programmed to initiate operations and memory.

Computing node 1200 is an example of computer hardware. Computing node 1200 may include fewer components than shown or additional components not illustrated in FIG. 12 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Figure 13:
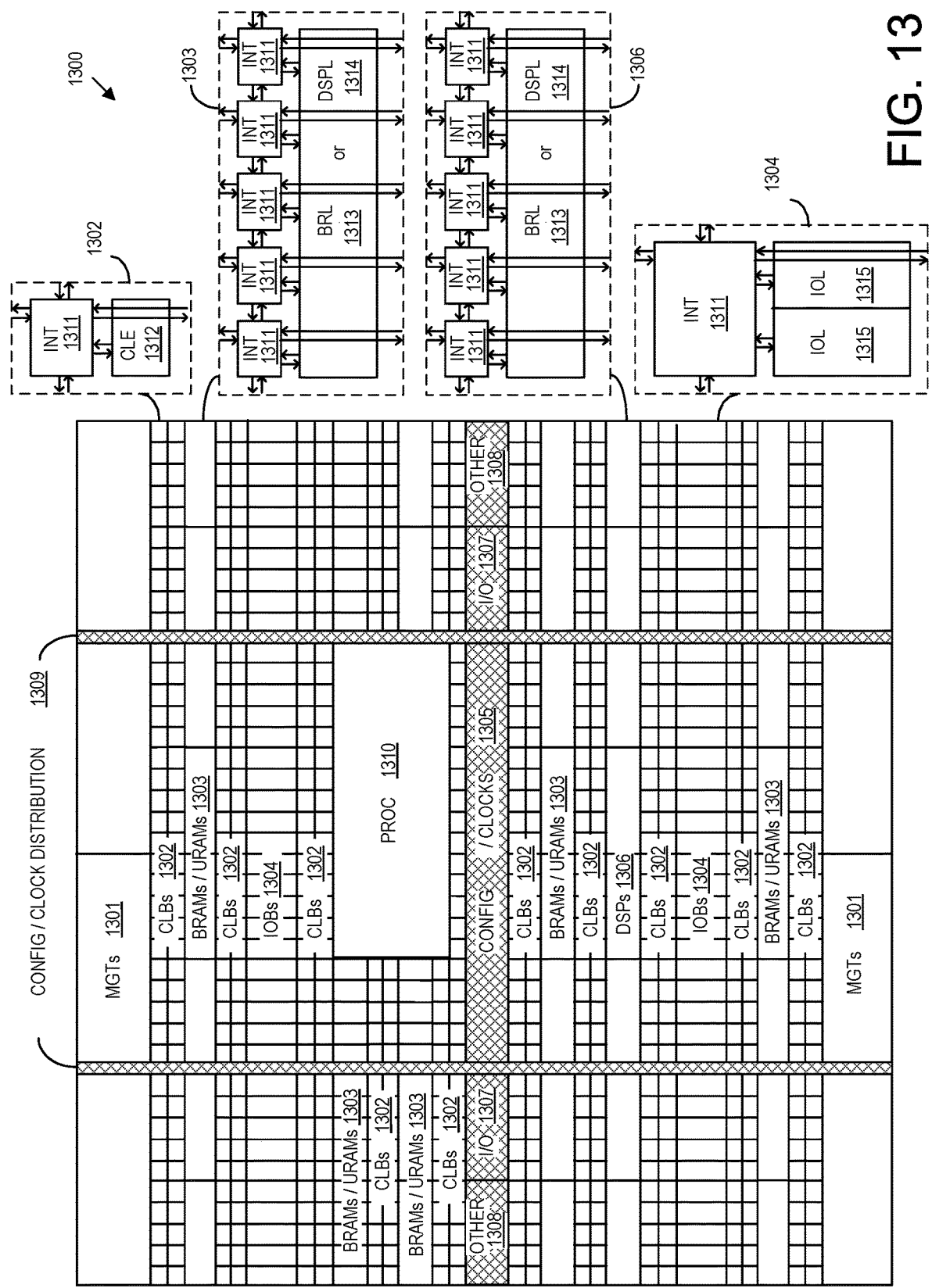
FIG. 13 illustrates an example architecture for an IC.

FIG. 13 illustrates an example architecture 1300 for an IC. In one aspect, architecture 1300 may be implemented within a programmable IC. For example, architecture 1300 may be used to implement a field programmable gate array (FPGA). Architecture 1300 may also be representative of a system-on-chip (SoC) type of IC. An SoC is an IC that includes a processor that executes program code and one or more other circuits. The other circuits may be implemented as hard-wired circuitry, programmable circuitry, and/or a combination thereof. The circuits may operate cooperatively with one another and/or with the processor. In one aspect, architecture 1300 may be representative of an IC in which an HDL memory may be implemented as described within this disclosure.

As shown, architecture 1300 includes several different types of programmable circuit, e.g., logic, blocks. For example, architecture 1300 may include a large number of different programmable tiles including multi-gigabit transceivers (MGTs) 1301, configurable logic blocks (CLBs) 1302, memory blocks such as BRAMs and/or URAMs 1303, input/output blocks (IOBs) 1304, configuration and clocking logic (CONFIG/CLOCKS) 1305, digital signal processing blocks (DSPs) 1306, specialized I/O blocks 1307 (e.g., configuration ports and clock ports), and other programmable logic 1308 such as digital clock managers, analog-to-digital converters, system monitoring logic, distributed RAM, and so forth.

In some ICs, each programmable tile includes a programmable interconnect element (INT) 1311 having standardized connections to and from a corresponding INT 1311 in each adjacent tile. Therefore, INTs 1311, taken together, implement the programmable interconnect structure for the illustrated IC. Each INT 1311 also includes the connections to and from the programmable logic element within the same tile, as shown by the examples included at the right of FIG. 13.

For example, a CLB 1302 may include a configurable logic element (CLE) 1312 that may be programmed to implement user logic plus a single INT 1311. A BRAM may include a BRAM logic element (BRL) 1313 in addition to one or more INTs 1311. URAMs may be similarly implemented. Typically, the number of INTs 1311 included in a tile depends on the height of the tile. As pictured, a BRAM tile has the same height as five CLBs, but other numbers (e.g., four) also may be used. A DSP tile 1306 may include a DSP logic element (DSPL) 1314 in addition to an appropriate number of INTs 1311. An 10B 1304 may include, for example, two instances of an I/O logic element (IOL) 1315 in addition to one instance of an INT 1311. The actual I/O pads connected to IOL 1315 may not be confined to the area of IOL 1315.

In the example pictured in FIG. 13, a horizontal area near the center of the die, e.g., formed of regions 1305, 1307, and 1308, may be used for configuration, clock, and other control logic. Vertical areas 1309 extending from this horizontal area may be used to distribute the clocks and configuration signals across the breadth of the programmable IC.

Some ICs utilizing the architecture illustrated in FIG. 13 include additional logic blocks that disrupt the regular columnar structure making up a large part of the IC. The additional logic blocks may be programmable blocks and/or dedicated circuitry. For example, a processor block depicted as PROC 1310 spans several columns of CLBs and BRAMs.

In one aspect, PROC 1310 may be implemented as dedicated circuitry, e.g., as a hardwired processor, that is fabricated as part of the die that implements the programmable circuitry of the IC. PROC 1310 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1310 may be omitted from architecture 1300 and replaced with one or more of the other varieties of the programmable blocks described. Further, such blocks may be utilized to form a "soft processor" in that the various blocks of programmable circuitry may be used to form a processor that can execute program code as is the case with PROC 1310.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 13 that are external to PROC 1310 such as CLBs 1302 and BRAMs and/or URAMs 1303 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1310.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 1310 or a soft processor. In some cases, architecture 1300 includes a dedicated configuration processor that loads the configuration bitstream to the appropriate configuration memory and/or processor memory. The dedicated configuration processor does not execute user-specified program code. In other cases, architecture 1300 may utilize PROC 1310 to receive the configuration bitstream, load the configuration bitstream into appropriate configuration memory, and/or extract program code for execution.

FIG. 13 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 13 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1310 within the IC are for purposes of illustration only and are not intended as limitations.

A system as described herein in connection with FIG. 12, for example, is capable of further processing a circuit design having undergone the processing described herein for implementation within an IC having an architecture the same as or similar to that of FIG. 13. The system, for example, is capable of synthesizing, placing, and routing the circuit design. The system may also perform bitstream generation so that the bitstream may be loaded into the IC, thereby physically implementing the circuit design and HDL memory within the IC.

For example, an IC implementing using an architecture the same as or similar to that of FIG. 13 may include a heterogeneous memory array formed of different types of memory primitives of the IC, input circuitry coupled to the heterogeneous memory array, and output circuitry coupled to the heterogeneous memory array. The heterogeneous memory array is accessible via the input circuitry and the output circuitry and is configured to operate as a single, unified memory.

In one aspect, the heterogeneous memory array, the input circuitry, and the output circuitry physically implement an HDL memory specified as a single module of HDL.

In another aspect, the heterogeneous memory array includes a plurality of sub-arrays, wherein each sub-array includes only memory primitives of the integrated circuit that are of a same type.

In another aspect, a first sub-array of the heterogeneous memory array includes only memory primitives of a first type and a second sub-array of the heterogeneous memory array includes only memory primitives of a second type.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
   determining, using computer hardware, a width and a depth of a hardware description language (HDL) memory specified as an HDL module for implementation in an integrated circuit;
   partitioning, using the computer hardware, the HDL memory into a plurality of super slices corresponding to columns and the plurality of super slices into a plurality of super tiles arranged in rows;
   generating, using the computer hardware, a heterogeneous memory array formed of different types of memory primitives of the integrated circuit; and
   generating, using the computer hardware, input circuitry and output circuitry configured to access the heterogeneous memory array:
   wherein the input circuitry and the output circuitry are coupled to the heterogeneous memory array such that the heterogeneous memory array is accessible via the input circuitry and the output circuitry to operate as a single, unified memory; and
   wherein the heterogeneous memory array includes:
     a first sub-array including only memory primitives of a first type, wherein each memory primitive of the first type has a first size providing a first amount of storage; and
     a second sub-array including only memory primitives of a second type, wherein each memory primitive of the second type has a second size providing a second amount of storage that differs from the first amount of storage.

2. The method of claim 1, further comprising:
   assigning the different types of memory primitives to the plurality of super tiles according to a size of each super tile, wherein each super tile corresponds to a sub-array of the heterogeneous memory array.

3. The method of claim 2, wherein
   the type of memory primitive assigned to each super tile is determined independently.

4. The method of claim 1, further comprising:
   determining compatibility of the different types of memory primitives with the HDL memory; and
   excluding each type of memory primitive of the integrated circuit that is incompatible with the HDL memory from use in the heterogeneous memory array.

5. The method of claim 1, wherein
   the plurality of super slices have widths determined based on a widest of the plurality of types of memory primitives of the integrated circuit.

6. The method of claim 1, wherein
   the plurality of super tiles have at least one of different depths or different widths.

7. The method of claim 1, further comprising:
   creating new data signals, address signals, and control signals from respective ones of data signals, address signals, and control signals of the HDL memory.

8. The method of claim 1, further comprising:
   combining data outputs from the plurality of super tiles to create a data output for each of the plurality of super slices; and
   combining the data outputs of the plurality of super slices to create a data output for the heterogeneous memory array.

9. A system, comprising:
   a processor configured to initiate operations including:
     determining a width and a depth of a hardware description language (HDL) memory specified as an HDL module for implementation in an integrated circuit;
     partitioning the HDL memory into a plurality of super slices corresponding to columns and the plurality of super slices into a plurality of super tiles arranged in rows;
     generating a heterogeneous memory array formed of different types of memory primitives of the integrated circuit; and
     generating input circuitry and output circuitry configured to access the heterogeneous memory array;
     wherein the input circuitry and the output circuitry are coupled to the heterogeneous memory array such that the heterogeneous memory array is accessible via the input circuitry and the output circuitry to operate as a single, unified memory; and
     wherein the heterogeneous memory array includes:
       a first sub-array including only memory primitives of a first type, wherein each memory primitive of the first type has a first size providing a first amount of storage; and
       a second sub-array including only memory primitives of a second type, wherein each memory primitive of the second type has a second size providing a second amount of storage that differs from the first amount of storage.

10. The system of claim 9, wherein the processor is configured to initiate operations comprising:

assigning the different types of memory primitives to the plurality of super tiles according to a size of each super tile, wherein each super tile corresponds to a sub-array of the heterogeneous memory array.

11. The system of claim 10, wherein the type of memory primitive assigned to each super tile is determined independently.

12. The system of claim 9, wherein the processor is configured to initiate operations comprising:
determining compatibility of the different types of memory primitives with the HDL memory; and
excluding each type of memory primitive of the integrated circuit that is incompatible with the HDL memory from use in the heterogeneous memory array.

13. The system of claim 9, wherein the plurality of super slices have widths determined based on a widest of the plurality of types of memory primitives of the integrated circuit.

14. The system of claim 9, wherein the plurality of super tiles have at least one of different depths or different widths.

15. The system of claim 9, wherein the processor is configured to initiate operations comprising:
creating new data signals, address signals, and control signals from respective ones of data signals, address signals, and control signals of the HDL memory.

16. The system of claim 9, wherein the processor is configured to initiate operations comprising:
combining data outputs from the plurality of super tiles to create a data output for each of the plurality of super slices; and
combining the data outputs of the plurality of super slices to create a data output for the heterogeneous memory array.

17. An integrated circuit, comprising:
a heterogeneous memory array formed of different types of memory primitives of the integrated circuit;
input circuitry coupled to the heterogeneous memory array; and
output circuitry coupled to the heterogeneous memory array;
wherein the heterogeneous memory array is accessible via the input circuitry and the output circuitry and is configured to operate as a single, unified memory; and
wherein the heterogeneous memory array includes:
a first sub-array including only memory primitives of a first type, wherein each memory primitive of the first type has a first size providing a first amount of storage; and
a second sub-array including only memory primitives of a second type, wherein each memory primitive of the second type has a second size providing a second amount of storage that differs from the first amount of storage.

18. The integrated circuit of claim 17, wherein each memory primitive of the first type has a defined width and depth and each memory primitive of the second type has a defined width and depth, and wherein at least one of the width or depth of each memory primitive of the first type differs from that of the width or depth of each memory primitive of the second type.

19. The integrated circuit of claim 17, wherein:
the heterogeneous memory array includes a plurality of super-slices, wherein each super-slice includes a portion of the first sub-array and a portion of the second sub-array;
each portion of the first sub-array and each portion of the second sub-array in a first super-slice of the plurality of super-slices has dedicated read and write decoder circuitry; and
each portion of the first sub-array and each portion of the second sub-array in a second super-slice of the plurality of super-slices has dedicated read and write decoder circuitry.

20. The integrated circuit of claim 17, wherein:
the integrated circuit includes programmable circuitry that is programmed to couple the memory primitives of the first type and the memory primitives of the second type to implement the heterogeneous memory array.

* * * * *